(12) United States Patent
Yeh et al.

(10) Patent No.: US 9,660,017 B2
(45) Date of Patent: May 23, 2017

(54) MICROELECTRONIC PACKAGE WITH SURFACE MOUNTED PASSIVE ELEMENT

(71) Applicant: MEDIATEK INC., Hsin-Chu (TW)

(72) Inventors: Chao-Yang Yeh, New Taipei (TW); Chee-Kong Ung, Hsinchu (TW); Tzu-Hung Lin, Hsinchu County (TW); Jia-Wei Fang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/925,995

(22) Filed: Oct. 29, 2015

(65) Prior Publication Data

US 2016/0211318 A1    Jul. 21, 2016

Related U.S. Application Data

(60) Provisional application No. 62/105,435, filed on Jan. 20, 2015, provisional application No. 62/134,014, filed on Mar. 17, 2015.

(51) Int. Cl.
| | | |
|---|---|---|
| *H01L 23/34* | (2006.01) | |
| *H01L 49/02* | (2006.01) | |
| *H01L 23/31* | (2006.01) | |
| *H01L 23/498* | (2006.01) | |
| *H01L 23/00* | (2006.01) | |
| *H01L 25/16* | (2006.01) | |

(52) U.S. Cl.
CPC .......... *H01L 28/40* (2013.01); *H01L 23/3157* (2013.01); *H01L 23/49816* (2013.01); *H01L 24/09* (2013.01); *H01L 24/19* (2013.01); *H01L 25/16* (2013.01); *H01L 28/10* (2013.01); *H01L 28/20* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/02371* (2013.01); *H01L 2224/0401* (2013.01); *H01L 2224/04105* (2013.01); *H01L 2224/12105* (2013.01); *H01L 2224/131* (2013.01); *H01L 2224/16227* (2013.01); *H01L 2224/16265* (2013.01); *H01L 2224/32225* (2013.01); *H01L 2224/73204* (2013.01); *H01L 2224/92125* (2013.01);

(Continued)

(58) Field of Classification Search
CPC .......... H01L 23/3157; H01L 23/49816; H01L 28/40; H01L 24/09; H01L 28/10; H01L 28/20
USPC .................................................. 257/724, 532
See application file for complete search history.

(56) References Cited

U.S. PATENT DOCUMENTS 6,563,192 B1 * 5/2003 Corisis ................ H01L 23/5223
257/277
6,584,328 B1 * 6/2003 Kung ................ G01C 21/3682
340/995.1

(Continued)

FOREIGN PATENT DOCUMENTS

JP          2942363 B2    6/1999

*Primary Examiner* — Nitin Parekh
(74) *Attorney, Agent, or Firm* — Winston Hsu; Scott Margo

(57) ABSTRACT

A microelectronic package includes a packaging substrate having a chip mounting surface; a chip mounted on the chip mounting surface of the packaging substrate with the chip's active surface facing down to the chip mounting surface; a plurality of input/output (I/O) pads distributed on the active surface of the chip; and a discrete passive element mounted on the active surface of the chip. The discrete passive element may be a decoupling capacitor, a resistor, or an inductor.

9 Claims, 2 Drawing Sheets

(52) U.S. Cl.
CPC ............... *H01L 2924/15159* (2013.01); *H01L 2924/15311* (2013.01); *H01L 2924/18162* (2013.01); *H01L 2924/19041* (2013.01); *H01L 2924/19042* (2013.01); *H01L 2924/19043* (2013.01); *H01L 2924/19103* (2013.01); *H01L 2924/19104* (2013.01)

(56) References Cited

U.S. PATENT DOCUMENTS

| | | | | |
|---|---|---|---|---|
| 6,756,664 B2* | 6/2004 | Yang | ...................... | H01L 23/552 257/691 |
| 7,067,914 B2* | 6/2006 | Malinowski | ............ | H01L 23/60 257/203 |
| 7,791,192 B1* | 9/2010 | Joshi | ........................ | H01L 23/04 257/499 |
| 8,049,303 B2* | 11/2011 | Osaka | ................... | H01L 23/481 257/532 |
| 8,368,150 B2* | 2/2013 | Lin | ...................... | H01L 23/3171 257/379 |
| 2002/0071258 A1* | 6/2002 | Mosley | .................... | H01G 4/30 361/782 |
| 2004/0012085 A1* | 1/2004 | Shioga | ................ | H01L 23/3107 257/723 |
| 2004/0022038 A1* | 2/2004 | Figueroa | ............... | H01L 23/642 361/763 |
| 2008/0284003 A1* | 11/2008 | Kwang | ................... | H01L 24/83 257/724 |
| 2014/0374877 A1* | 12/2014 | Oh | ...................... | H01L 23/5223 257/532 |

* cited by examiner

MICROELECTRONIC PACKAGE WITH SURFACE MOUNTED PASSIVE ELEMENT

CROSS REFERENCE TO RELATED APPLICATIONS

This application claims the benefit of U.S. provisional application No. 62/105,435 filed Jan. 20, 2015. This application also claims the benefit of U.S. provisional application No. 62/134,014 filed Mar. 17, 2015.

BACKGROUND

As system complexity and operational speeds increase, the power consumption of integrated circuits increases dramatically. Additionally, the IC supply voltage continues to drop with the inevitable scaling of VLSI technology.

Reducing the nominal supply voltage is accompanied by a reduction in device noise margins, making components more vulnerable to power supply noise. This noise consists of the dynamic AC voltage fluctuation due to the frequency dependent distributed parasitics inherent in today's power distribution systems, and the DC voltage drop (i.e., "IR" drop).

In a microelectronic system, the system's IR drop may be budgeted into three portions: on-chip, package and board. On-chip IR drop has been extensively studied because the resistive loss is severe due to the fine feature-size of the on-die power grid.

To reduce the IR drop and improve power integrity, decoupling capacitors are typically mounted on a top surface of a packaging substrate or disposed within the packaging substrate. However, the aforesaid substrate-level decoupling capacitors are still not close enough to the IC die in the package to cope with the on-chip IR drop.

It is desirable to place a high-performance capacitor as close to the IC die as possible to shorten the transient response time.

SUMMARY

It is an objective of the claimed invention to provide an improved microelectronic package with surface mounted passive element such as a decoupling capacitor disposed in close proximity to the IC die, which is capable of reducing the IR drop and improving power integrity, and is cost-effective.

According to one aspect of the invention, a microelectronic package includes a packaging substrate having a chip mounting surface; a chip mounted on the chip mounting surface of the packaging substrate with the chip's active surface facing down to the chip mounting surface; a plurality of input/output (I/O) pads distributed on the active surface of the chip; and a discrete passive element mounted on the active surface of the chip. The discrete passive element may be a decoupling capacitor, a resistor, or an inductor.

According to another aspect of the invention, a microelectronic package includes a packaging substrate having a chip mounting surface; a chip mounted on the chip mounting surface of the packaging substrate with the chip's active surface facing down to the chip mounting surface; a plurality of input/output (I/O) pads distributed on the active surface of the chip; a redistribution layer (RDL) structure directly on the active surface of the chip between the chip and the chip mounting surface of the packaging substrate; and a discrete passive element mounted on the RDL structure. A plurality of bumps is disposed on RDL structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

The present invention pertains to an improved microelectronic package with at least one embedded, discrete decoupling capacitor that is disposed in close proximity to the IC die in the chip package. The embedded, thin decoupling capacitor effectively reduces on-chip IR drop.

Figure 1:
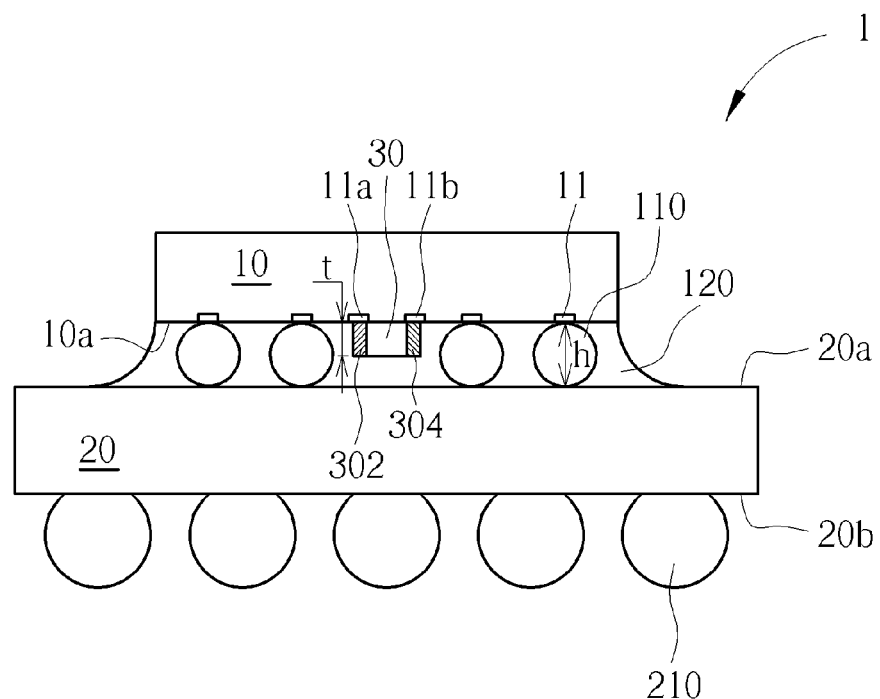
FIG. 1 is a schematic, cross-sectional diagram showing a microelectronic package such as a flip-chip BGA (FCBGA) package in accordance with one embodiment of the invention.

FIG. 1 is a schematic, cross-sectional diagram showing a microelectronic package such as a flip-chip BGA (FCBGA) package in accordance with one embodiment of the invention. As shown in FIG. 1, the microelectronic package 1 includes a packaging substrate 20 having a chip mounting surface 20a and a bottom surface 20b. A chip 10 is mounted on the chip mounting surface 20a of the packaging substrate 20. A plurality of solder balls 210 are implanted on the bottom surface 20b.

The chip 10 has an active surface 10a. A plurality of input/output (I/O) pads 11 are provided on the active surface 10a. The chip 10 is flipped and is assembled face-down to the chip mounting surface 20a. The chip 10 is electrically connected to the packaging substrate 20 through a plurality of bumps 110 to form a flip-chip BGA package. The bumps 110 have a bump height h. An underfill 120 may be optionally provided between the bumps 110 underneath the chip 10.

According to the illustrative embodiment, a discrete passive element 30 such as a decoupling capacitor, a resistor, an inductor, or any suitable integrated passive device (IPD) is mounted directly on the active surface 10a of the chip 10. According to the illustrative embodiment, the discrete passive element 30 is a decoupling capacitor and includes a terminal 302 and a terminal 304. According to the illustrative embodiment, the terminals 302 and 304 may be electrically connected to a ground I/O pad 11a and a power I/O pad 11b respectively.

According to the illustrative embodiment, the discrete passive element 30 may be directly mounted on the active surface 10a by using a surface mounting technology (SMT) or any suitable soldering process. According to the illustrative embodiment, the discrete passive element 30 has thickness t that is smaller than the bump height h. For example, the thickness t is less than 80 micrometers, but not limited thereto.

Figure 2:
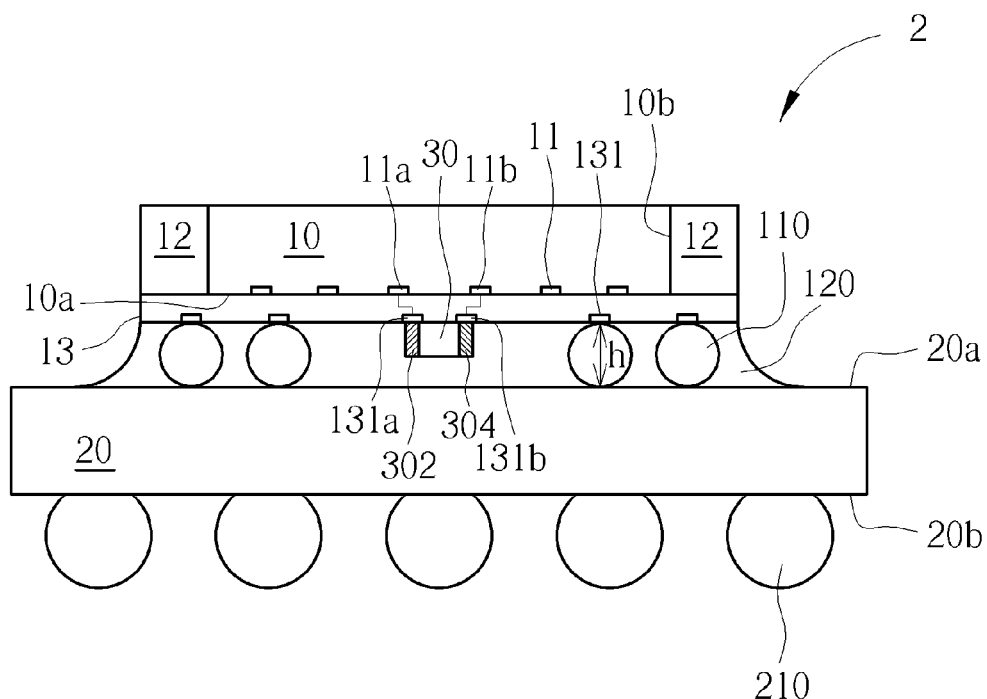
FIG. 2 is a schematic, cross-sectional diagram showing a microelectronic package such as a Fan-Out Wafer-Level-Package (Fan-Out WLP) in accordance with another embodiment of the invention.

FIG. 2 is a schematic, cross-sectional diagram showing a microelectronic package such as a Fan-Out Wafer-Level-Package (Fan-Out WLP) in accordance with another embodiment of the invention, wherein like numeral numbers designate like regions, layers or elements. As shown in FIG. 2, likewise, the microelectronic package 2 includes a packaging substrate 20 having a chip mounting surface 20a and a bottom surface 20b. A chip 10 is mounted on the chip mounting surface 20a of the packaging substrate 20. A plurality of solder balls 210 are implanted on the bottom surface 20b.

The chip 10 has an active surface 10a and four side edges 10b. The four side edges 10b of the chip 10 are encapsulated and surrounded by a molding compound 12. A plurality of input/output (I/O) pads 11 are provided on the active surface 10a and on the molding compound 12. A rewiring or redistribution layer (RDL) structure 13 is formed directly on the active surface 10a to fan out the I/O pads 11 to thereby form a plurality of bump pads 131 having a looser pad pitch. The bumps 110 have a bump height h. An underfill 120 may be optionally provided between the bumps 110 underneath the chip 10. The details of the wiring and dielectric layers of the RDL structure 13 are not explicitly shown.

According to the illustrative embodiment, a discrete passive element 30 such as a decoupling capacitor, a resistor, or an inductor is mounted directly on the RDL structure 13. According to the illustrative embodiment, the discrete passive element 30 is a decoupling capacitor and includes a terminal 302 and a terminal 304. According to the illustrative embodiment, the terminals 302 and 304 may be electrically connected to a bump pad 131a that is related to a ground I/O pad on the active surface 11a and a bump pad 131b that is related to a power I/O pad 11b respectively.

According to the illustrative embodiment, the discrete passive element 30 may be directly mounted on the RDL structure 13 by using a surface mounting technology (SMT). According to the illustrative embodiment, the discrete passive element 30 has thickness t that is smaller than the bump height h. For example, the thickness t is less than 80 micrometers, but not limited thereto.

Figure 3:
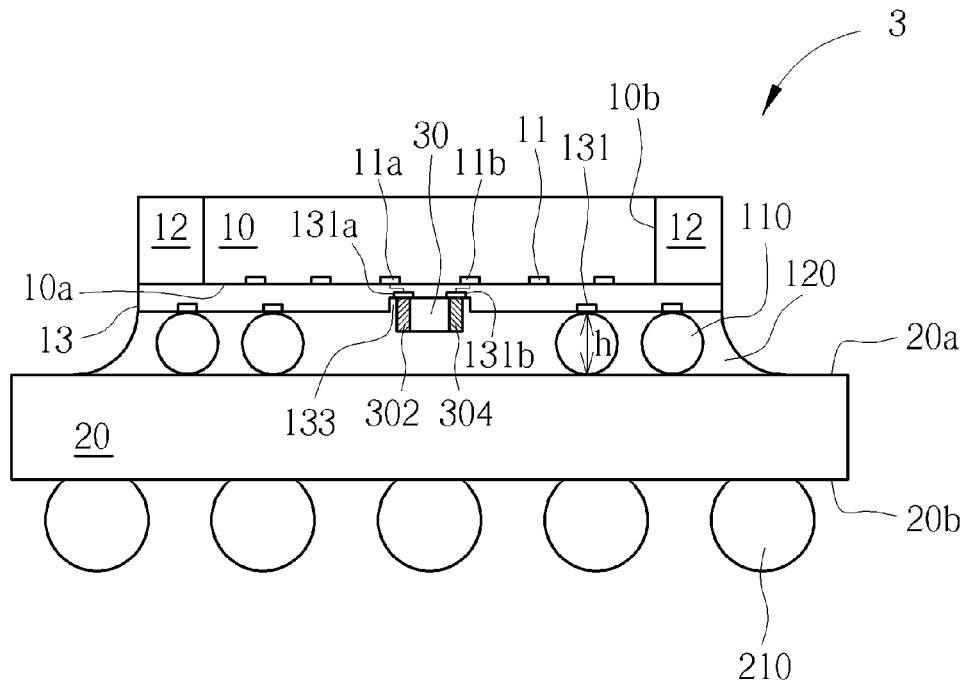
FIG. 3 is a schematic, cross-sectional diagram showing a microelectronic package such as a Fan-Out WLP in accordance with another embodiment of the invention.

FIG. 3 is a schematic, cross-sectional diagram showing a microelectronic package such as a Fan-Out WLP in accordance with another embodiment of the invention, wherein like numeral numbers designate like regions, layers or elements. As shown in FIG. 3, likewise, the microelectronic package 3 includes a packaging substrate 20 having a chip mounting surface 20a and a bottom surface 20b. A chip 10 is mounted on the chip mounting surface 20a of the packaging substrate 20. A plurality of solder balls 210 are implanted on the bottom surface 20b.

The chip 10 has an active surface 10a and four side edges 10b. The four side edges 10b of the chip 10 are encapsulated and surrounded by a molding compound 12. A plurality of input/output (I/O) pads 11 are provided on the active surface 10a. An RDL structure 13 is formed directly on the active surface 10a to fan out the I/O pads 11 to thereby form a plurality of bump pads 131 having a looser pad pitch. The bumps 110 have a bump height h. For example, the bump height h may be smaller than 80 micrometers. An underfill 120 may be optionally provided between the bumps 110. The details of the wiring and dielectric layers of the RDL structure 13 are not explicitly shown.

According to the illustrative embodiment, a discrete passive element 30 such as a decoupling capacitor, a resistor, or an inductor is mounted within a cavity 133 recessed into the RDL structure 13. According to the illustrative embodiment, the discrete passive element 30 is a decoupling capacitor and includes a terminal 302 and a terminal 304. According to the illustrative embodiment, the terminals 302 and 304 may be electrically connected to a bump pad 131a that is related to a ground I/O pad on the active surface 11a and a bump pad 131b that is related to a power I/O pad 11b respectively. The bump pads 131a and 131b are disposed at the bottom surface of the cavity 133.

According to the illustrative embodiment, the discrete passive element 30 may be directly mounted within the cavity 133 by using a surface mounting technology (SMT). According to the illustrative embodiment, the discrete passive element 30 has thickness t that may be equal to or smaller than the bump height h. For example, the thickness t is less than 80 micrometers, but not limited thereto.

Figure 4:
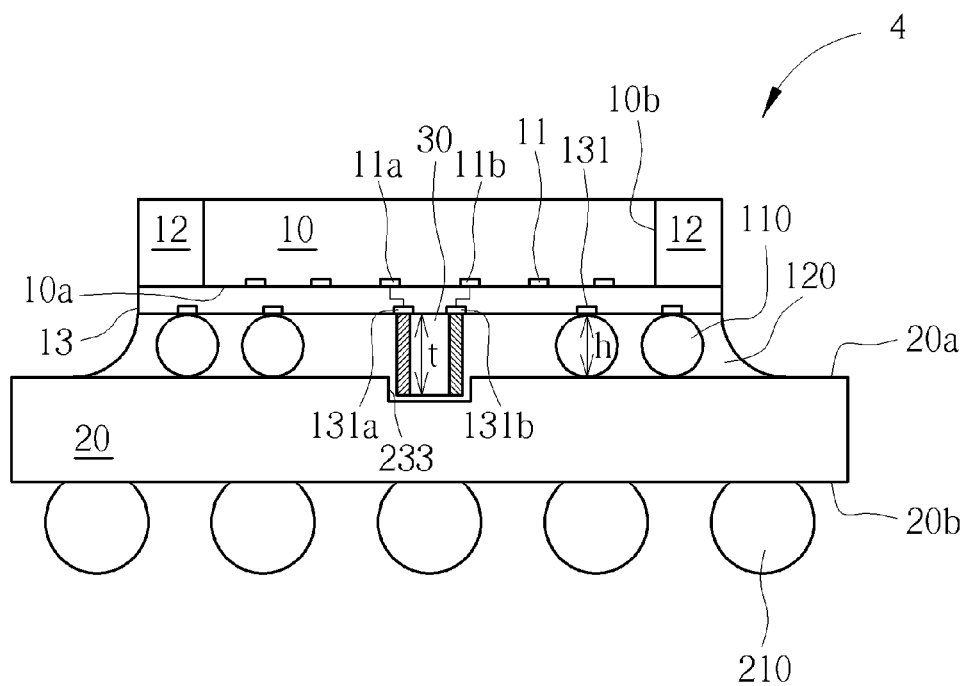
FIG. 4 is a schematic, cross-sectional diagram showing a microelectronic package such as a Fan-Out WLP in accordance with still another embodiment of the invention.

FIG. 4 is a schematic, cross-sectional diagram showing a microelectronic package such as a Fan-Out WLP in accordance with still another embodiment of the invention, wherein like numeral numbers designate like regions, layers or elements. As shown in FIG. 4, likewise, the microelectronic package 4 includes a packaging substrate 20 having a chip mounting surface 20a and a bottom surface 20b. A chip 10 is mounted on the chip mounting surface 20a of the packaging substrate 20. A plurality of solder balls 210 are implanted on the bottom surface 20b.

The chip 10 has an active surface 10a and four side edges 10b. The four side edges 10b of the chip 10 are encapsulated and surrounded by a molding compound 12. A plurality of input/output (I/O) pads 11 are provided on the active surface 10a. A rewiring or redistribution layer (RDL) structure 13 is formed directly on the active surface 10a to fan out the I/O pads 11 to thereby form a plurality of bump pads 131 having a looser pad pitch. The bumps 110 have a bump height h. An underfill 120 may be optionally provided between the bumps 110. The details of the wiring and dielectric layers of the RDL structure 13 are not explicitly shown.

According to the illustrative embodiment, a discrete passive element 30 such as a decoupling capacitor, a resistor, or an inductor is mounted directly on the RDL structure 13. According to the illustrative embodiment, the discrete passive element 30 is a decoupling capacitor and includes a terminal 302 and a terminal 304. According to the illustrative embodiment, the terminals 302 and 304 may be electrically connected to a bump pad 131a that is related to a ground I/O pad on the active surface 11a and a bump pad 131b that is related to a power I/O pad 11b respectively.

According to the illustrative embodiment, the discrete passive element 30 may be directly mounted on the RDL structure 13 by using a surface mounting technology (SMT). According to the illustrative embodiment, the discrete passive element 30 has thickness t that is larger than the bump height h. For example, the thickness t is greater than 80 micrometers, but not limited thereto.

Since the discrete passive element 30 has thickness t that is larger than the bump height h, a cavity 233 corresponding to the discrete passive element 30 is provided in the chip mounting surface 20a. The cavity 233 has a depth that is deep enough to accommodate the lower portion of the discrete passive element 30. According to the illustrative embodiment, the discrete passive element 30 is not in direct contact with the packaging substrate 20 and the underfill 120 may flow into the gap between the discrete passive element 30 and the packaging substrate 20.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A microelectronic package, comprising:
    a packaging substrate having a chip mounting surface;
    a chip mounted on the chip mounting surface of the packaging substrate with the chip's active surface facing down to the chip mounting surface;
    a plurality of input/output (I/O) pads distributed on the active surface of the chip;
    a redistribution layer (RDL) structure directly on the active surface of the chip between the chip and the chip mounting surface of the packaging substrate;
    a cavity recessed into the RDL structure; and
    a discrete passive element mounted within the cavity.

2. The microelectronic package according to claim 1, wherein four side edges of the chip are encapsulated and surrounded by a molding compound.

3. The microelectronic package according to claim 1, wherein the discrete passive element comprises a decoupling capacitor, a resistor, or an inductor.

4. The microelectronic package according to claim 1, wherein the plurality of I/O pads comprise a ground I/O pad and a power I/O pad.

5. The microelectronic package according to claim 4, wherein the discrete passive element is a decoupling capacitor comprising a first terminal and a second terminal, and wherein the first terminal is electrically connected to the ground I/O pad through a first bump pad in the RDL structure and the second terminal is electrically connected to the power I/O pad through a second bump pad in the RDL structure.

6. The microelectronic package according to claim 1, wherein the discrete passive element is directly mounted on the RDL structure.

7. The microelectronic package according to claim 1 further comprising a plurality of bumps on RDL structure.

8. The microelectronic package according to claim 7, wherein the plurality of bumps has a bump height.

9. The microelectronic package according to claim 8, wherein the discrete passive element has a thickness smaller than the bump height.

* * * * *